US012284919B2

United States Patent
Kim et al.

(10) Patent No.: US 12,284,919 B2
(45) Date of Patent: Apr. 22, 2025

(54) $Mg_2Sn$ THERMOELECTRIC MATERIALS FOR COLOSSAL SEEBECK COEFFICIENTS AND FABRICATION METHOD THEREFOR

(71) Applicant: Industry-Academic Cooperation Foundation, Chosun University, Gwangju (KR)

(72) Inventors: Sa Ra Kim, Gwangju (KR); Nam Hoon Kim, Gwangju (KR)

(73) Assignee: Industry-Academic Cooperation Foundation, Chosun University, Gwangju (KR)

( * ) Notice: Subject to any disclaimer, the term of this patent is extended or adjusted under 35 U.S.C. 154(b) by 0 days.

(21) Appl. No.: 18/201,666

(22) Filed: May 24, 2023

(65) Prior Publication Data

US 2024/0065104 A1 Feb. 22, 2024

(30) Foreign Application Priority Data

Aug. 22, 2022 (KR) .................. 10-2022-0104881

(51) Int. Cl.
*H10N 10/854* (2023.01)
*H10N 10/851* (2023.01)
*H10N 10/857* (2023.01)

(52) U.S. Cl.
CPC ......... *H10N 10/854* (2023.02); *H10N 10/851* (2023.02); *H10N 10/857* (2023.02)

(58) Field of Classification Search
CPC ... H10N 10/851; H10N 10/857; H10N 10/854
See application file for complete search history.

(56) References Cited

FOREIGN PATENT DOCUMENTS

KR 1020120138959 A 12/2012

OTHER PUBLICATIONS

Safavi et al. "Thermoelectric properties improvement in Mg2Sn thin films by structural modification". Journal of Alloys and Compounds,797, (2019), 1078-1085 (Year: 2019).*
Park et al. "Enhancement of p-type thermoelectric properties in an Mg2Sn system". Journal of the Korean Physical Society, vol. 60, No. 10, May 2012, pp. 1717~1723. (Year: 2012).*
Tani et al. "Thermoelectric properties of Mg2Sn thin films fabricated using radio frequency magnetron sputtering". Thin Solid Films 692 (2019) 137601 (Year: 2019).*
Kim, Sara, et al., "Electronic Structure and Thermoelectric Properties of Mg2Sn Films Fabricated by Using Co-Sputtering Process with Stoichiometric Modification", IEEE Access, vol. 10, Dec. 23, 2021, pp. 380-390.
Office Action received in Korean Application No. 10-2022-0104881, dated Sep. 18, 2023, 5 pages.
Safavi, Mahsasadat, et al., "Thermoelectric Properties Improvement in Mg2Sn Thin Films by Structural Modification", Journal of Alloys and Compounds, vol. 797, Aug. 15, 2019, pp. 1078-1085.

(Continued)

*Primary Examiner* — Lindsey A Buck
(74) *Attorney, Agent, or Firm* — CM Law PLLC; Robert C. Klinger

(57) ABSTRACT

Disclosed according to various embodiments is a thermoelectric material for colossal Seebeck coefficients comprising an Mg-poor $Mg_2Sn$ crystal and Secondary Sn phase.

8 Claims, 24 Drawing Sheets

(56) References Cited

OTHER PUBLICATIONS

Tani, Jun-ichi, et al., "Thermoelectric Properties of Mg2Sn Thin Films Fabricated Using Radio Frequency Magnetron Sputtering", Thin Solid Films, vol. 692, Dec. 31, 2019, 5 pages.

Zheng, Zhuang-hao, et al., "Thermoelectric Properties of Co-Sputtered CoSb3 Thin Films as a Function of Stoichiometry", vol. 632, Jun. 2017, pp. 88-92.

\* cited by examiner

Mg₂Sn THERMOELECTRIC MATERIALS FOR COLOSSAL SEEBECK COEFFICIENTS AND FABRICATION METHOD THEREFOR

CROSS-REFERENCE TO RELATED APPLICATION

This application is based on and claims priority under 35 U.S.C. 119 to Korean Patent Application No. 10-2022-0104881, filed on Aug. 22, 2022, in the Korean Intellectual Property Office, the disclosure of which is herein incorporated by reference in its entirety.

BACKGROUND OF THE INVENTION

Field of the Invention

1. The present disclosure relates to a $Mg_2Sn$ thermoelectric material for colossal Seebeck coefficients and fabrication method therefor.

2. Description of the Prior Art

In the 21$^{st}$ century, the preservation of the global environment and the depletion of energy resources have emerged as important issues, requiring the development of alternative energy sources. Thermoelectric energy conversion technology has been attracting attention as an alternative energy technology because it can directly convert thermal energy into electrical energy and vice versa. Thermoelectric materials are eco-friendly energy conversion materials that can obtain electrical energy by utilizing abandoned or neglected thermal energy such as automobile and industrial waste heat and solar heat, and do not generate pollution such as noise, vibration, and waste.

Thermoelectric conversion technology can be classified into thermoelectric cooling technology and thermoelectric power generation technology. Thermoelectric cooling technology has the advantage of being able to replace refrigerant gas that causes global warming, obviating the need for compressors with the consequent elimination of vibration and noise, and enabling precise temperature control. Thermoelectric power generation technology is the only power generation method that can directly convert even low-temperature thermal energy and small-scale distributed thermal energy that are difficult to recycle into electrical energy and thus has advantages such as a long lifespan and the ability to convert waste heat into electricity, thereby reducing greenhouse gases.

The energy conversion efficiency of thermoelectric materials is evaluated by a dimensionless figure of merit (ZT), which is defined as $ZT=\alpha^2\sigma T/k$ wherein $\alpha$, $\sigma$, k, and T are the Seebeck coefficient, the electrical conductivity, thermal conductivity, and the absolute temperature, respectively. The product of the square of the Seebeck coefficient and the electrical conductivity is called the power factor ($\alpha^2\sigma$). Therefore, in order to obtain a thermoelectric material having high performance, a high power factor and low thermal conductivity are required. However, the Seebeck coefficient and the electrical conductivity are in a trade-off relationship. The electrical conductivity depends on carrier concentration, and as the electrical conductivity increases, the electronic thermal conductivity and the total thermal conductivity increase. Thus, optimized electrical and thermal properties are required to obtain a high thermoelectric figure of merit. In this regard, research has been conducted on the improvement of electrical properties through optimization of carrier concentration or on the reduction of thermal conductivity due to the vibration of elements loaded to in pores of the crystal structure.

On the other hand, there has recently been an increasing demand for environmentally friendly and cost-effective thermoelectric materials.

SUMMARY OF THE INVENTION

The present disclosure aims to provide a cost-effective and eco-friendly thermoelectric material with enhanced power factor and thermoelectric performance and a fabrication method therefor.

Thermoelectric materials according to various embodiments of the present disclosure include an Mg-poor $Mg_2Sn$ crystal and Secondary Sn phase.

Provided according to various embodiments of the present disclosure are a thermoelectric material with enhanced thermoelectric performance and a fabrication method therefor.

The thermoelectric material of the present disclosure includes $Mg_2Sn$ crystal with additional Sn phase formed as a result of Mg-poor (Sn-Rich) $Mg_2Sn$, thereby exhibiting very high Seebeck coefficients and power factors in the temperature range of 600-700 K. For instance, the thermoelectric material of the present disclosure may exhibit a Seebeck coefficient of more than $-10$ $mVK^{-1}$.

The fabrication method of the present disclosure can easily control the atomic ratio of Mg/Sn by taking advantage of co-sputtering. That is, a thermoelectric material having an Mg/Sn atomic ratio controlled into 1.5 to 2.0 can be fabricated by the fabrication method of the present disclosure.

BRIEF DESCRIPTION OF THE DRAWINGS

The above and other aspects, features and advantages of the present disclosure will be more apparent from the following detailed description taken in conjunction with the accompanying drawings, in which.

DETAILED DESCRIPTION OF THE EXEMPLARY EMBODIMENTS

Figure 1A:
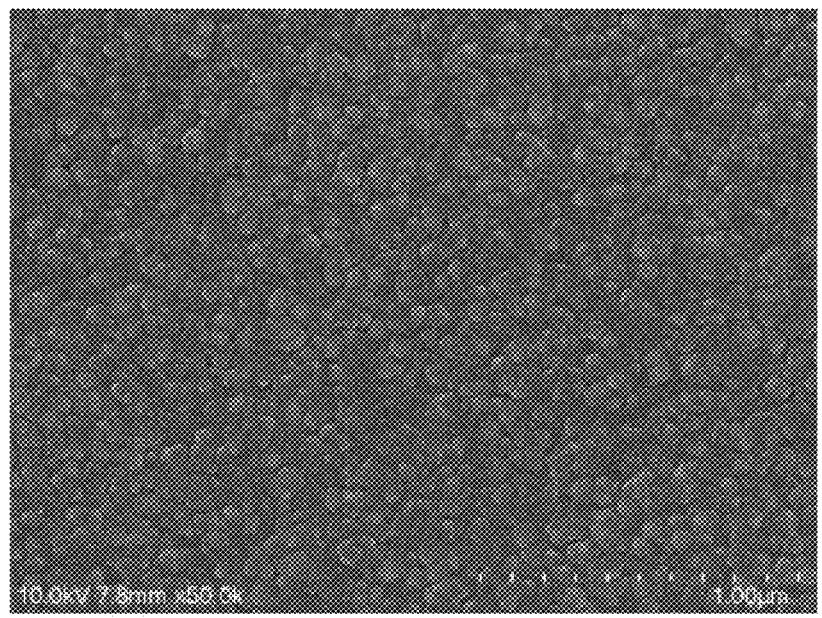
FIGS. 1A-1E show FESEM images of the Mg—Sn films fabricated with Mg/Sn atomic ratios of (a) 2.8, (b) 2.5, (c) 2.1, (d) 1.9, and (e) 1.4 in Example 1.
Figure 1B:
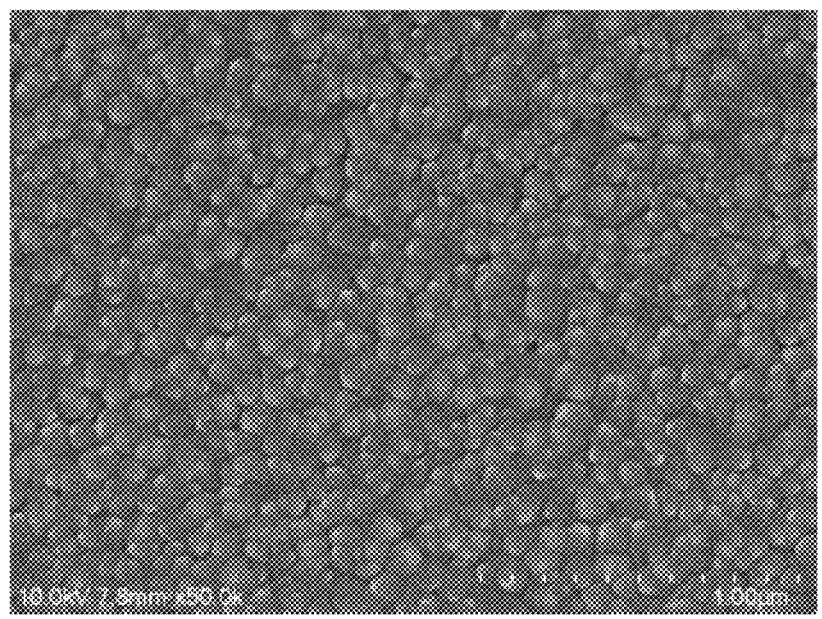
Figure 1C:
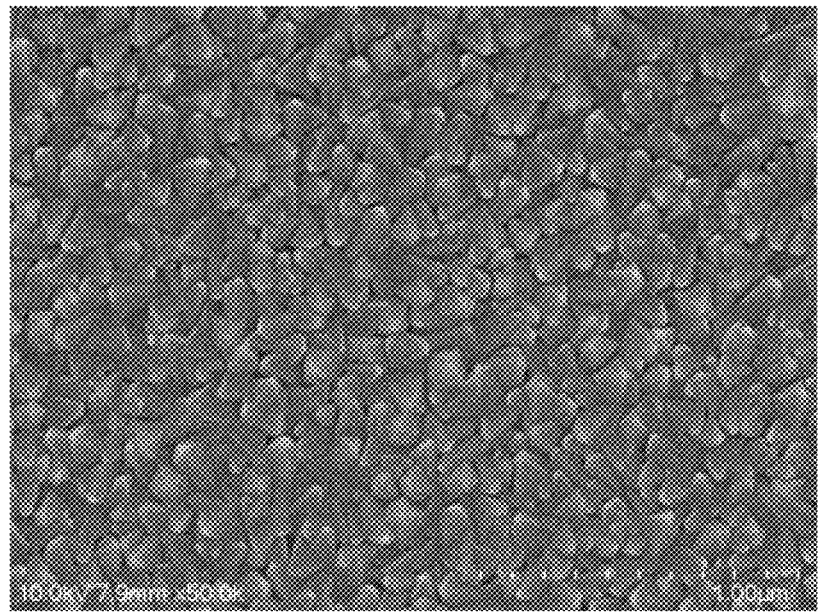
Figure 1D:
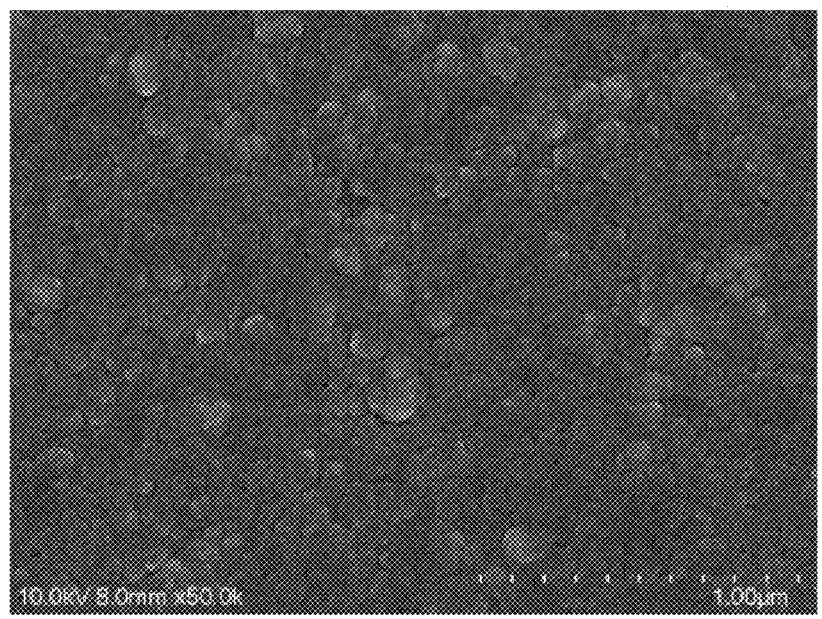
Figure 1E:
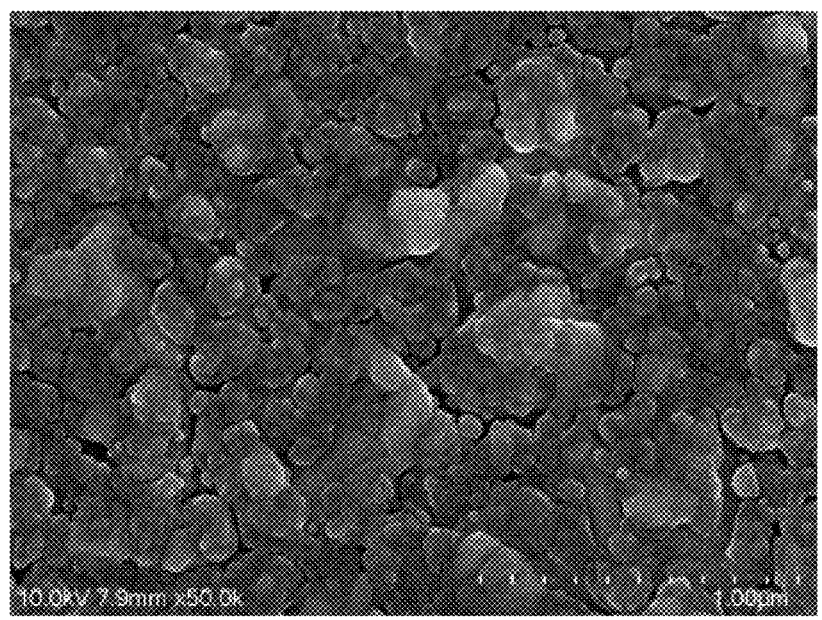
Figure 2A:
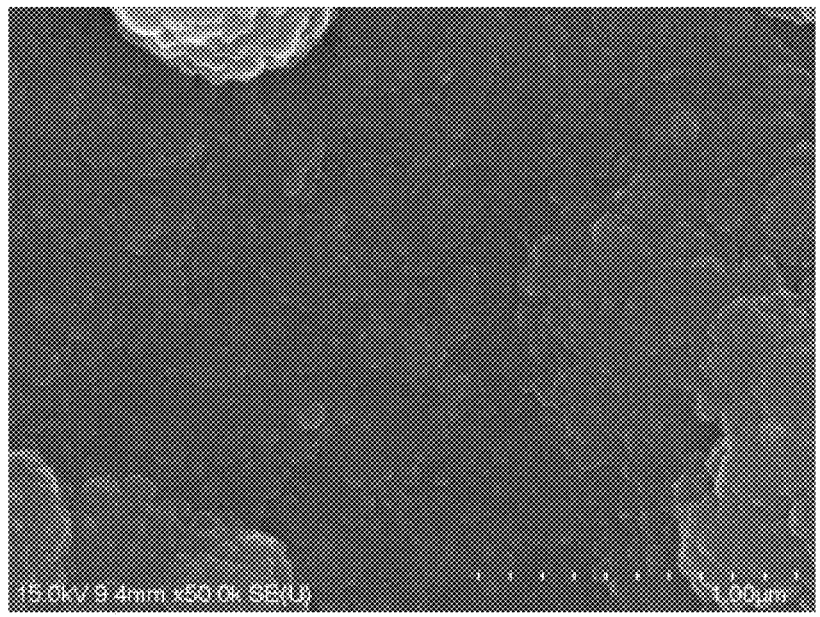
FIGS. 2A-2E show FESEM images of the Mg—Sn films fabricated with Mg/Sn atomic ratios of (a) 2.5, (b) 2.3, (c) 2.0, (d) 1.8, and (e) 1.5 in Example 2.
Figure 2B:
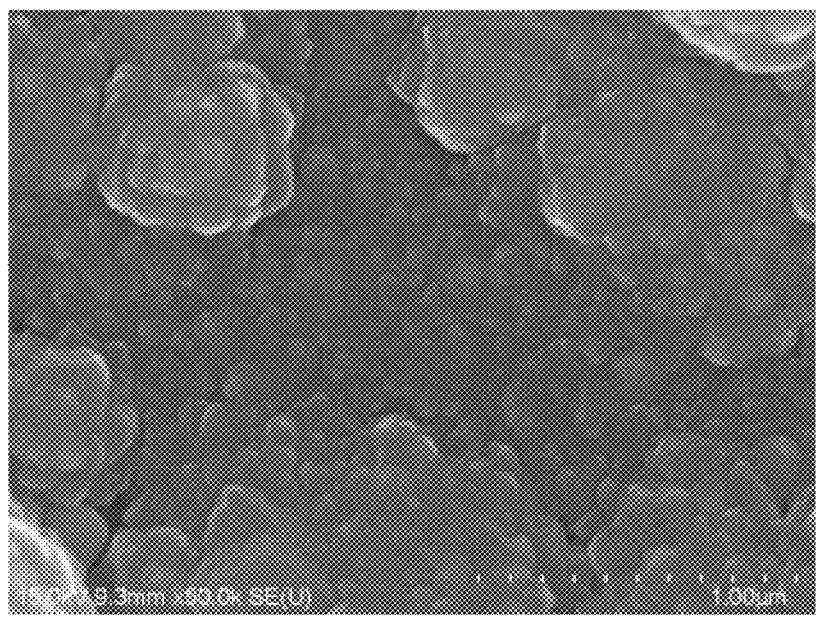
Figure 2C:
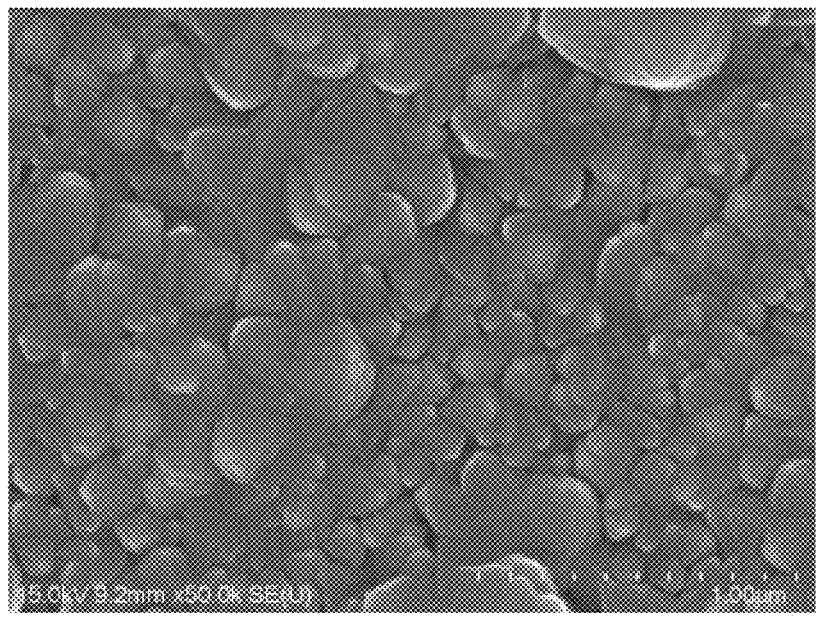
Figure 2D:
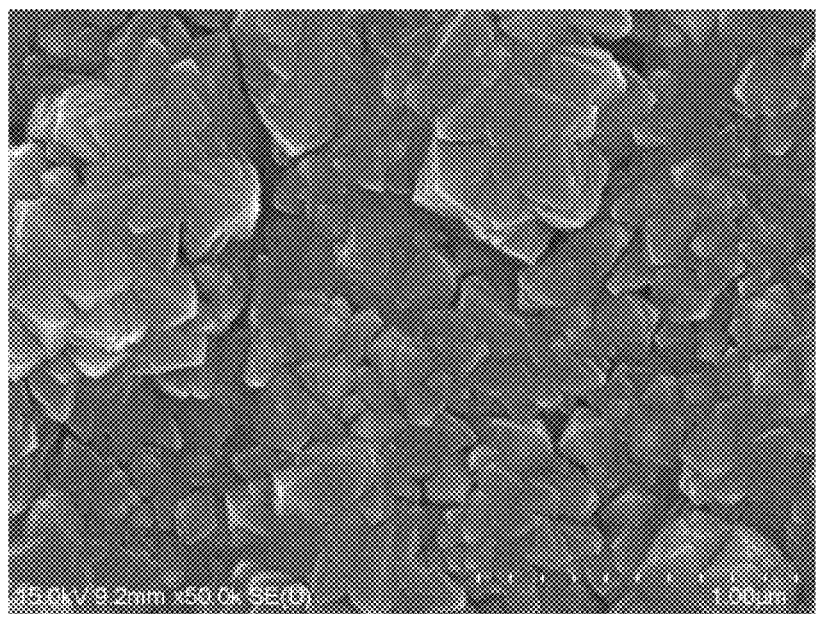
Figure 2E:
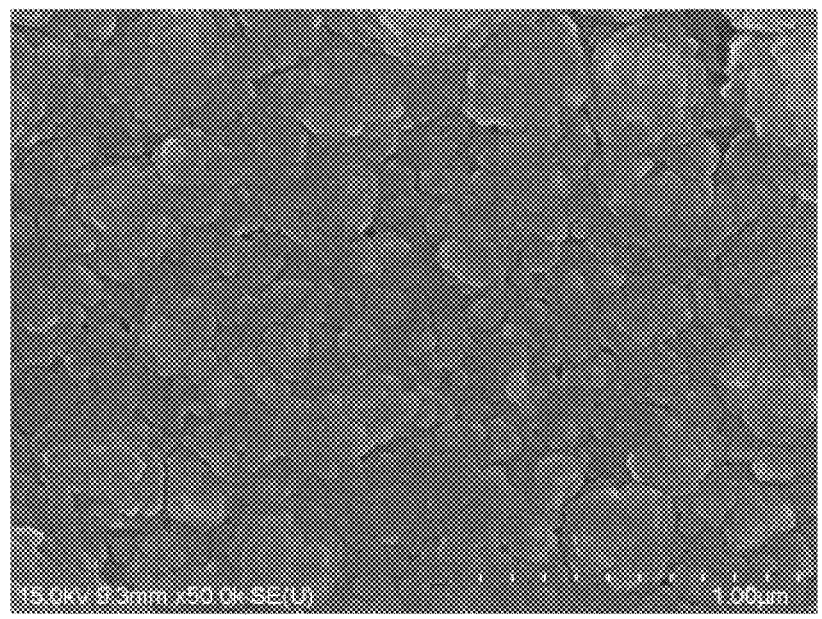

Hereinafter, various embodiments of this document will be described with reference to the accompanying drawings. However, it should be understood that technology described in this document is not limited to a specific embodiment and includes various modifications, equivalents, and/or alternatives of an embodiment of this document.

A thermoelectric material for colossal Seebeck coefficients according to various embodiments of the present disclosure includes an Mg-poor $Mg_2Sn$ crystal and Secondary Sn phase. The thermoelectric material according to various embodiments of the present disclosure may include only an Mg-poor $Mg_2Sn$ crystal and Secondary Sn phase.

That is, the thermoelectric material of the present disclosure may exhibit peaks at $2\theta=23.11, 24.05, 33.55, 40.80$, and $41.35$ corresponding to the planes (400), (221), (422), (125), and (523) of the Mg-poor $Mg_2Sn$ crystal and Secondary Sn phase as measured by XRD, respectively. Meanwhile, these peaks may vary depending on the fabrication method.

The thermoelectric material of the present disclosure includes a Mg—Sn film. In this regard, the Mg/Sn atomic ratio is 1.5 to 2.0. Preferably, the Mg/Sn atomic ratio may be 1.8. That is, the thermoelectric material may be a Mg-poor film in which a deficient amount of Mg is contained.

The thermoelectric material of the present disclosure has a thermal diffusion-induced gradient of Mg concentrations. For example, given a thermal gradient, the thermoelectric material of the present disclosure allows the Mg metal to partially ionize and migrate. That is, the dealloyed Mg atoms may diffuse from a hot side to a cool side and be concentrated/deposited thereat.

The thermoelectric material of the present disclosure may include a $Mg_2Sn$ alloy, a molten Sn metal, and a Mg element at a temperature of 300 to 500° C. When the thermoelectric material has a thermal gradient, the molten Sn metal may promote the migration of Mg particles.

The thermoelectric material of the present disclosure undergoes p-type to n-type transition at a temperature of 300 to 500° C.

The thermoelectric material of the present disclosure exhibits a very high Seebeck coefficient and power factor in a temperature range of 600-700 K. For example, the thermoelectric material of the present disclosure may exhibit a Seebeck coefficient exceeding $-10$ $mVK^{-1}$.

The method for preparing a thermoelectric material for colossal Seebeck coefficients according to the present disclosure may include the steps of: preparing a Sn target and a Mg target; co-sputtering the Sn target and the Mg target on a substrate.

In this regard, the method may further include a step of performing pre-sputtering before the co-sputtering step. For example, pre-sputtering may be carried out for 2 to 5 minutes.

The co-sputtering may be RF magnetron co-sputtering. For this, the following conditions are maintained: an Ar gas flux of 20 sccm, a base pressure of $1.0\times10^{-6}$ Torr, a substrate-to-target distance of 5.0 cm, and a vacuum pressure of $7.5\times10^{-3}$ RAT during sputtering at room temperature.

A sputtering power may be set forth to be 80 to 100 W for the Mg target. On the other hand, a sputtering power of 50 to 90 W may be set forth for the Sn target. However, the sputtering power is not limited thereto, but may be applied using various sputtering devices so that the thermoelectric material incudes an Mg-poor $Mg_2Sn$ crystal and Secondary Sn phase and has a Mg/Sn atomic ratio of 1.5 to 2.0.

In the method, the substrate having the Mg—Sn film deposited by co-sputtering. This co-sputtering step is configured to induce the Mg—Sn film to undergo dealloying and/or demagnesiation. Through this process, the Mg—Sn film may include a $Mg_2Sn$ alloy, a molten Sn metal, and a Mg element.

Below, various Examples of the present disclosure will be explained in conjunction with the accompanying drawings.

EXAMPLES

Mg—Sn films were deposited on $2\times2$ $cm^2$ Corning glass substrates using an RF magnetron co-sputtering system (IDT Engineering Co., Gyeonggi, Korea), with Mg (TASCO, Seoul, Korea, 99.99% purity, 2-inch diameter) target under a fixed sputtering power of 90 W and variable sputtering power for Sn (TASCO, 99.99% purity, 2-inch diameter) target from 50 to 90 W to give samples various Mg/Sn atomic ratios, while other parameters were kept constant using the following conditions: pre-sputtering process for 3 min prior to each run, an Ar gas flux of 20 sccm, base pressure of $1.0\times10^{-6}$ RAT, substrate-to-target distance of 5.0 cm, and vacuum pressure of $7.5\times10^{-3}$ RAT during sputtering at room temperature.

The crystalline structure of the thin films was analyzed using ex-situ X-ray diffraction (XRD, PANalytical B.V., Almelo, The Netherlands, X'pert-PRO-MRD, Cu $K\alpha=0.15405$ nm, 40 kV, 30 mA). Structural changes in the Mg—Sn films were monitored with time by in-situ XRD. FESEM (Hitachi, Tokyo, Japan, S-4700, without Pt coating) was employed to reveal the morphological characteristics of the Mg—Sn films. An energy dispersive X-ray spectrometer (EDS) attached to the FESEM and X-ray photoelectron spectroscopy (XPS, Thermo Fisher Scientific Inc., Waltham, MA, USA, K-Alpha+) were used to analyze the compositional analysis and chemical nature of the Mg—Sn films. The Hall properties, including the carrier concentration, resistivity, and mobility of the Mg—Sn films were characterized using an in-situ and ex-situ Hall effect measurement system (Accent Optical Technologies, Bend, OR, USA, HL5500PC) at room temperature. The resistivity (p) and the Seebeck coefficient (S) were simultaneously measured as a function of temperature to up to 500° C., using a Seepel Instrument system.

For comparative analysis, different conditions in sputtering power and time were set between Examples 1 and 2. In Example 1, pre-sputtering was conducted for 10 minutes so that Mg and Sn was co-sputtered in a range of very high sputtering speeds for Mg. The co-sputtering was carried out for 20 minutes. During sputtering, the power for Mg was fixed at 90 W while the Sn sputtering power was changed to obtain Mg-rich, stoichiometric, and Mg-poor films.

For the samples of Example 2, pre-sputtering was conducted for 3 minutes irrespective of Mg deposition speeds, followed by co-sputtering for 30 minutes. In Example 2, since it took about 10 minutes to acquire a high Mg deposition speed, a Mg-doped Sn thin film was formed on the substrate for the 10 minutes.

Experimental Example 1: Morphological and Compositional Analysis

Influences of process parameters and material characteristics on the surface morphology of the Mg—Sn film were examined using a field emission scanning electron microscope (FESEM) and the results are given in FIGS. 1A-1E and FIGS. 2A-2E. FIGS. 1A-1E show FESEM images of the Mg—Sn films fabricated with Mg/Sn atomic ratios of (a) 2.8, (b) 2.5, (c) 2.1, (d) 1.9, and (e) 1.4 in Example 1. FIGS. 2A-2E show FESEM images of the Mg—Sn films fabricated with Mg/Sn atomic ratios of (a) 2.5, (b) 2.3, (c) 2.0, (d) 1.8, and (e) 1.5 in Example 2.

The Mg—Sn films of Examples 1 and 2 were all free of cracks and showed uniform compositions over the entire surfaces thereof, but there was a distinct difference therebetween. Example 2 showed flower-like shapes, and the grains of Example 2 were almost spherical and generally much smaller in size. The morphological change with increasing of Sn concentration was more pronounced in Example 1.

Figure 3A:
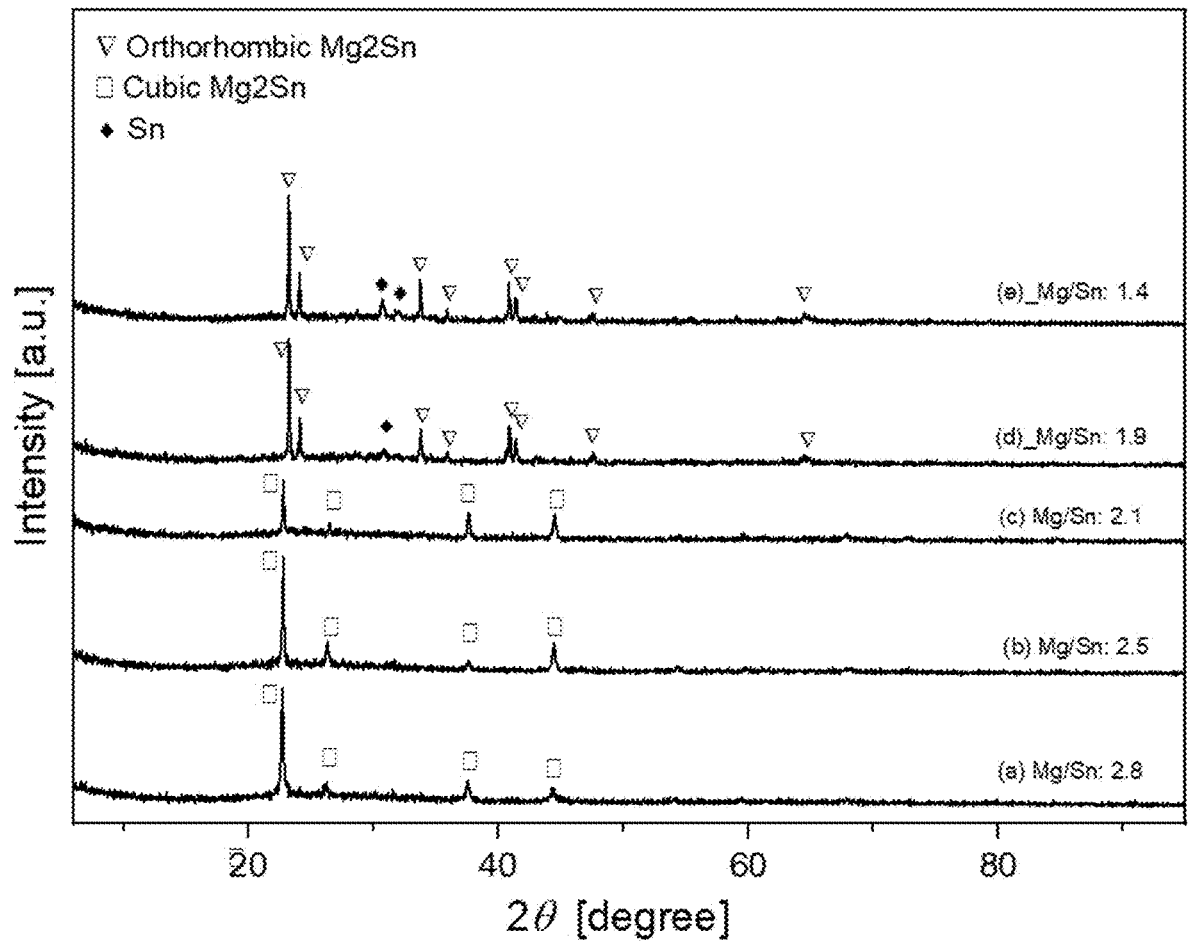
FIGS. 3A-3B show XRD patterns of Mg—Sn films fabricated by co-sputtering for (a) Example 1 and (b) Example 2 of Mg—Sn films.
Figure 3B:
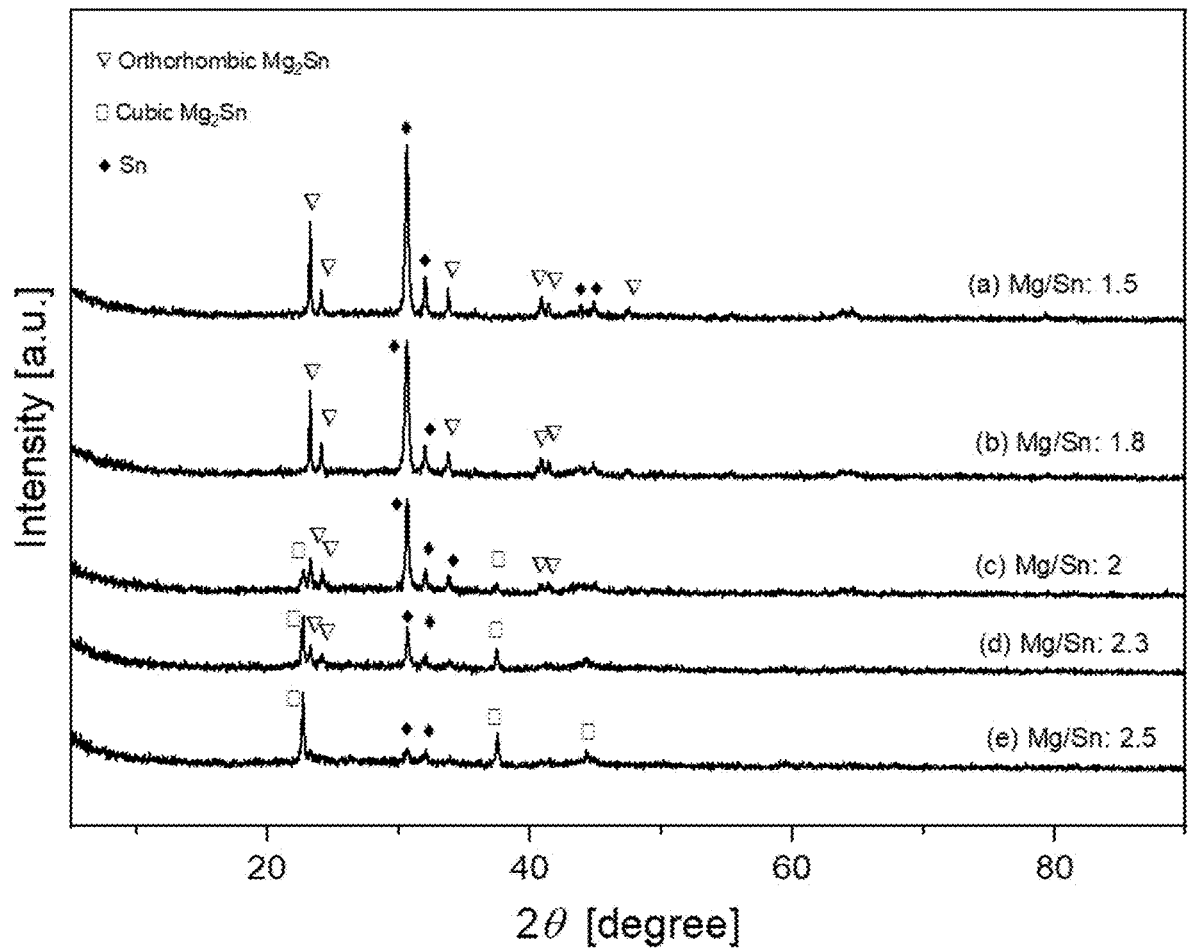

Phase structures of the Mg—Sn films were analyzed by x-ray diffractometer. In this Experimental Example, CuKa radiation was used for scanning at 2θ angles from 5° to 95° at a scan speed of 0.03° per sec. FIGS. 3A-3B show XRD patterns of deposited Mg—Sn films in both of Examples 1 and 2. Taking account of the XRD and EDS data together, it can be concluded that the Mg—Sn films in both of Examples 1 and 2 change from a Mg-rich cubic $Mg_2Sn$ phase (stable form, JCPDS No. 07-0274) to a Mg-poor, orthorhombic $Mg_2Sn$ phase (JCPDS No. 31-0812) with increasing of Sn sputtering power. To identify the phase of the $Mg_2Sn$ films, a standard JCPDS diffraction card available for Mg—Sn alloys was used. As the Sn concentration in the films increases, the XRD peaks of the cubic $Mg_2Sn$ phase at 2θ=22.7°, 37.4°, and 44.2° which correspond to the (111), (220), and (311) planes in the cubic $Mg_2Sn$ phase substantially disappeared or greatly decreased and new peaks appeared at 2θ=23.11, 24.05, 33.55, 40.80, and 41.35 which corresponds to (400), (221), (422), (125), and (523) planes of the orthorhombic $Mg_2Sn$ phase, respectively.

Experimental Example 2: Analysis for Electrical Properties

Figure 4A:
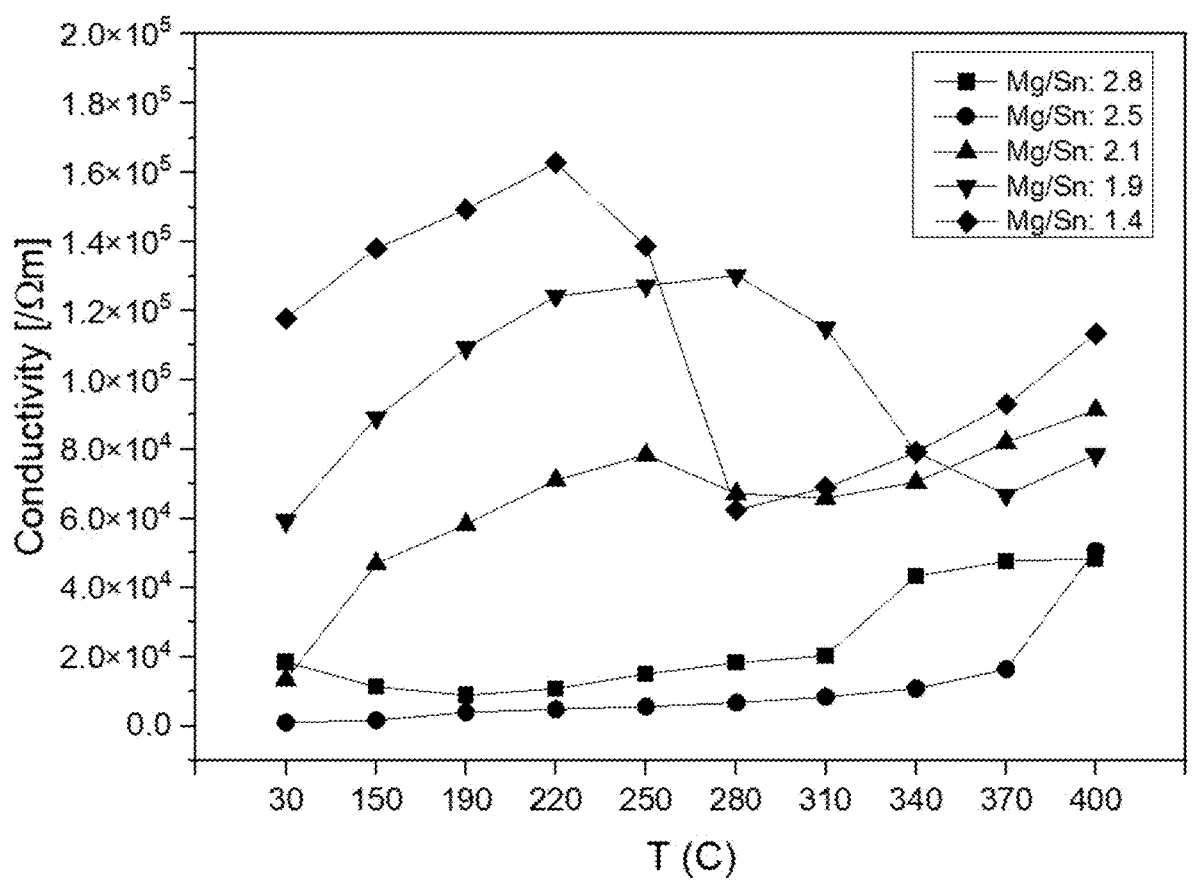
FIGS. 4A-4C show temperature dependence of thermoelectric properties: (a) conductivity, (b) Seebeck coefficient, and (c) PF of the Mg—Sn films of Example 1.
Figure 4B:
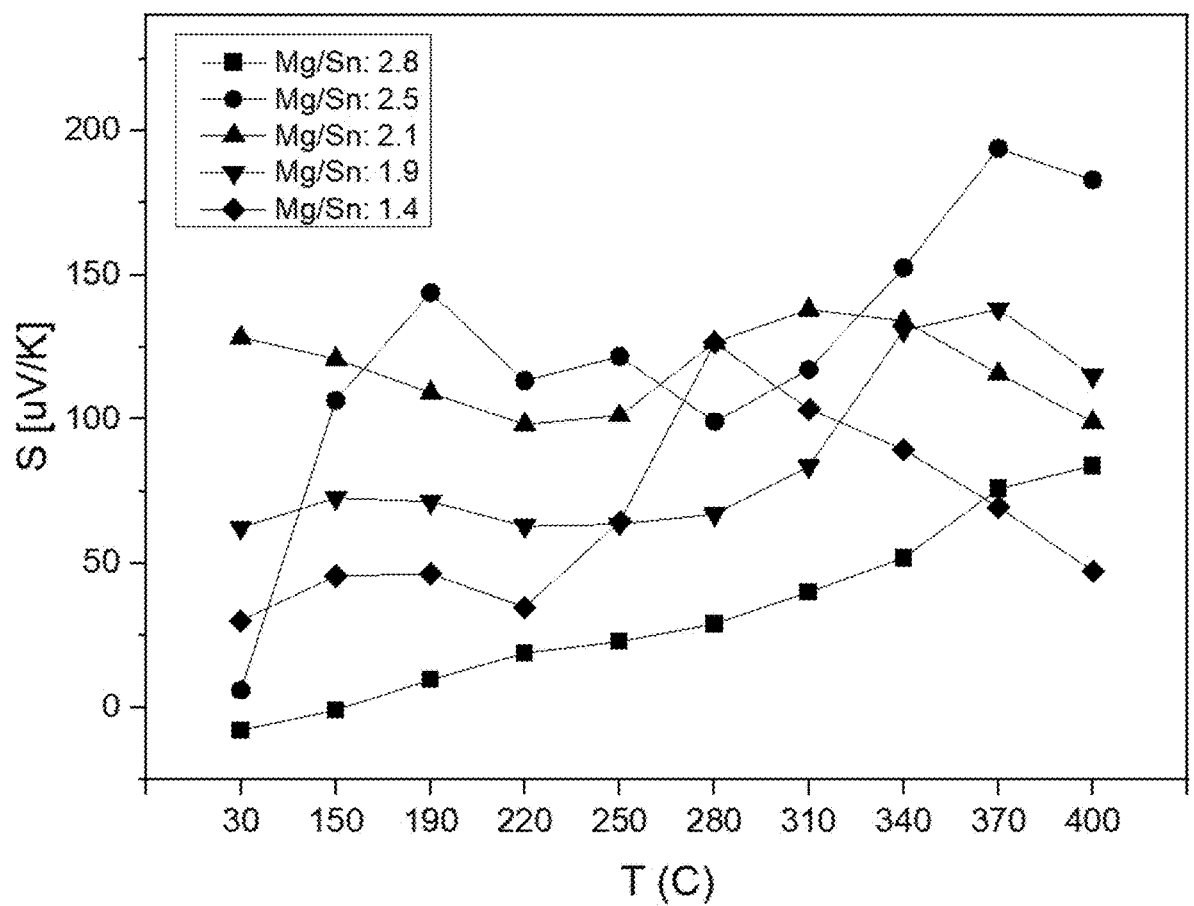
Figure 4C:
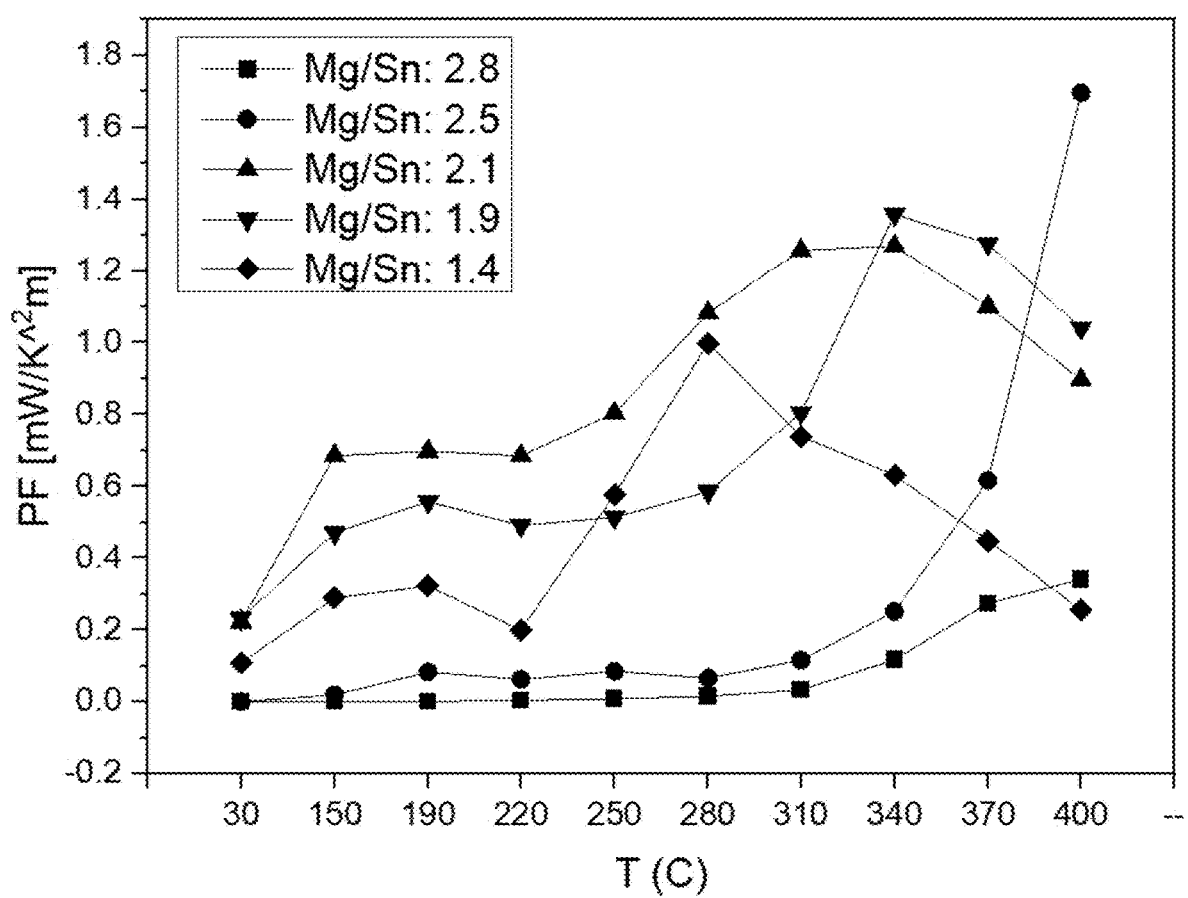
Figure 5A:
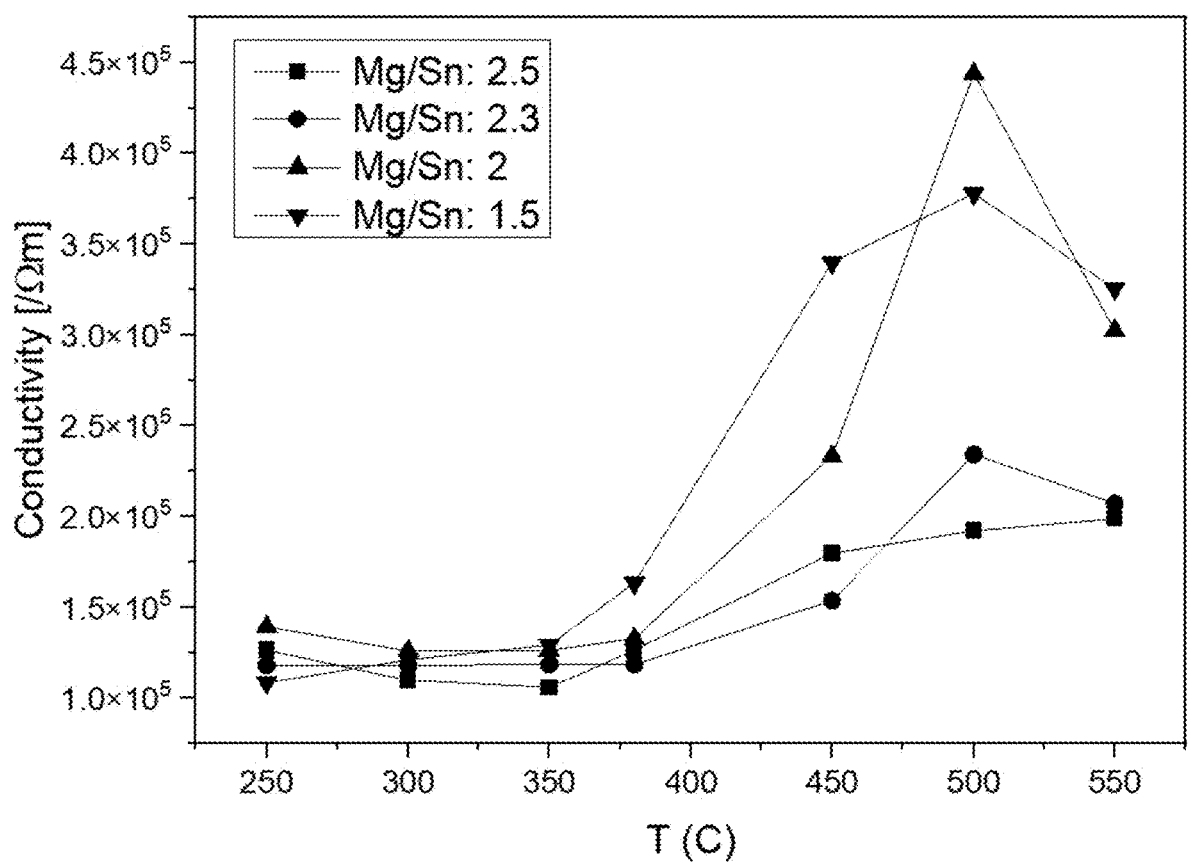
FIGS. 5A-5F show temperature dependence of thermoelectric properties: (a) conductivity, (b) Seebeck coefficient, (c) PF of the Mg—Sn films of Example 2, (d) conductivity of Mg/Sn:1.8, (e) log (Seebeck coefficient) of Mg/Sn:1.8, and (f) log(PF) of Mg/Sn:1.8.
Figure 5B:
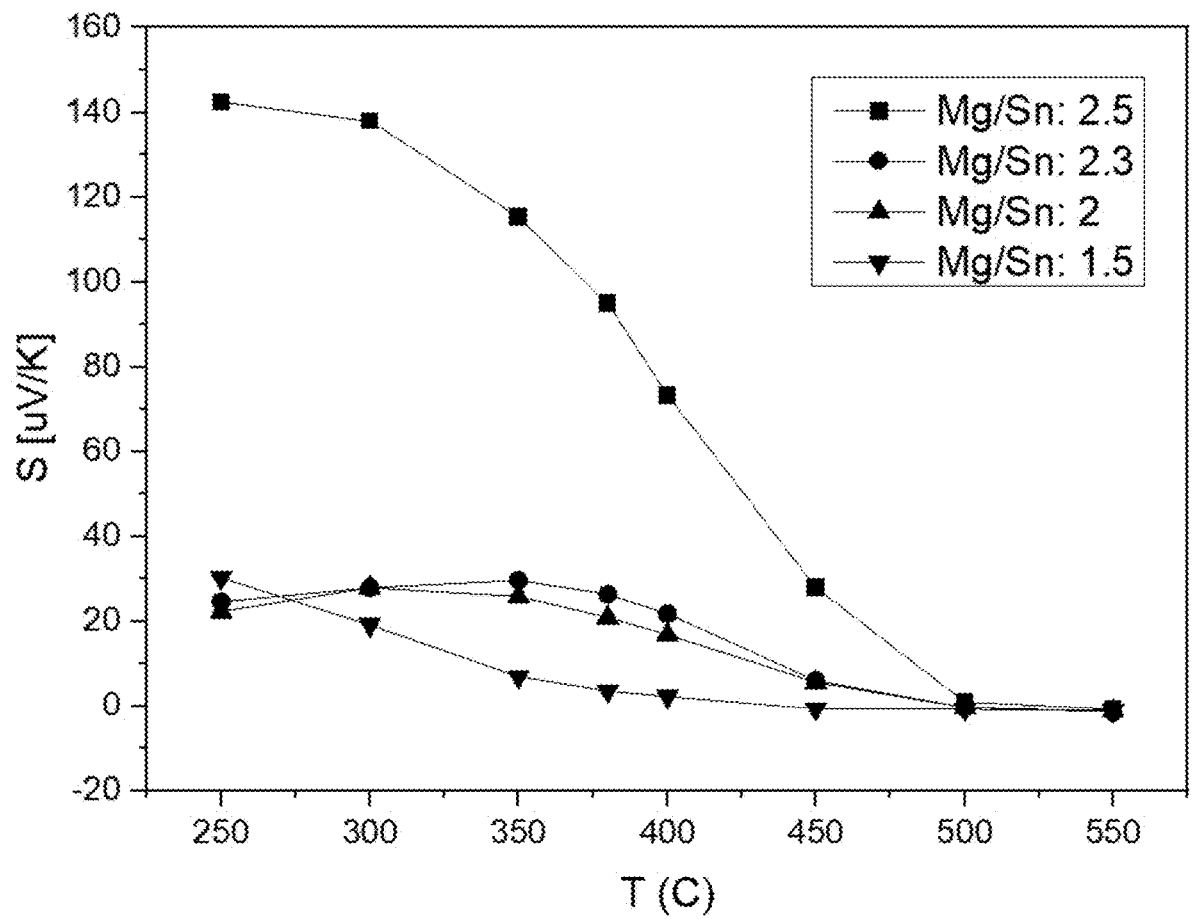
Figure 5C:
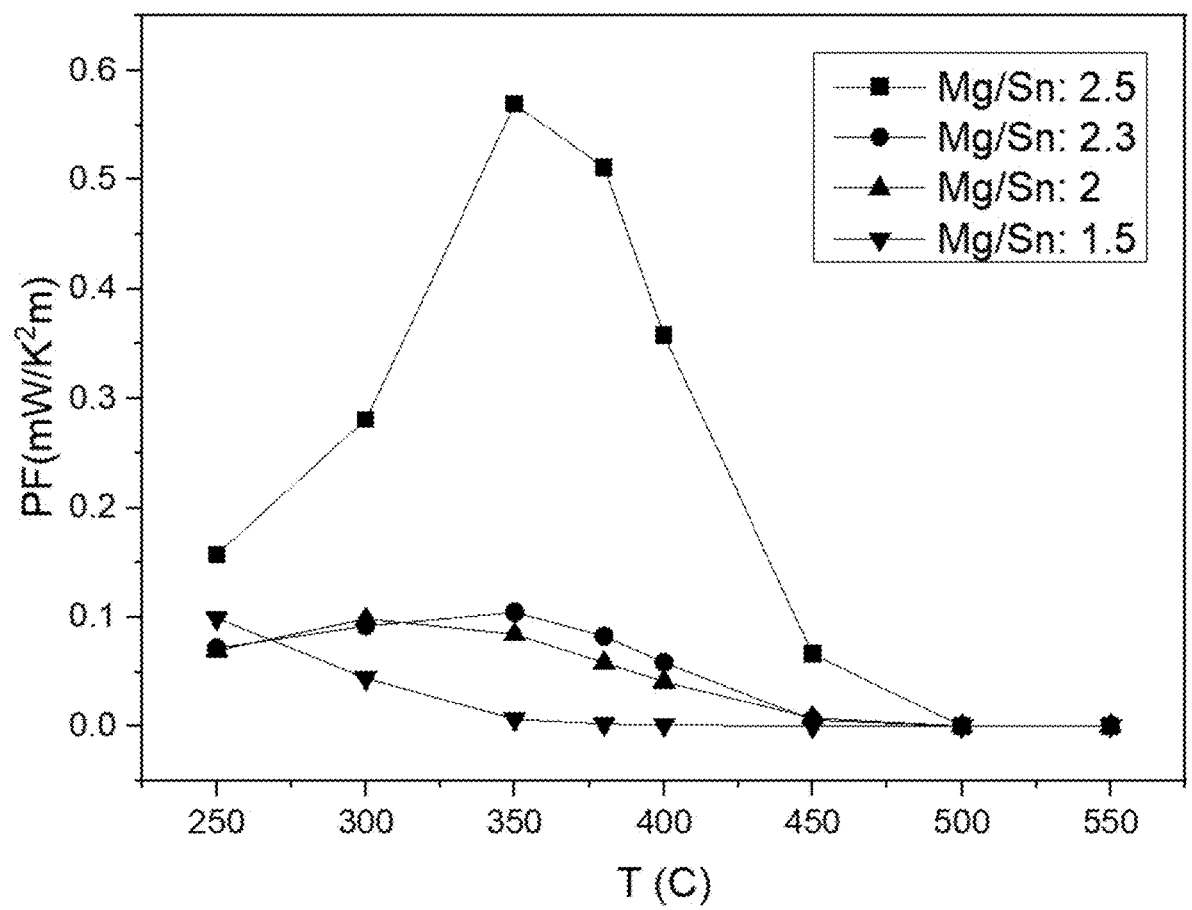
Figure 5D:
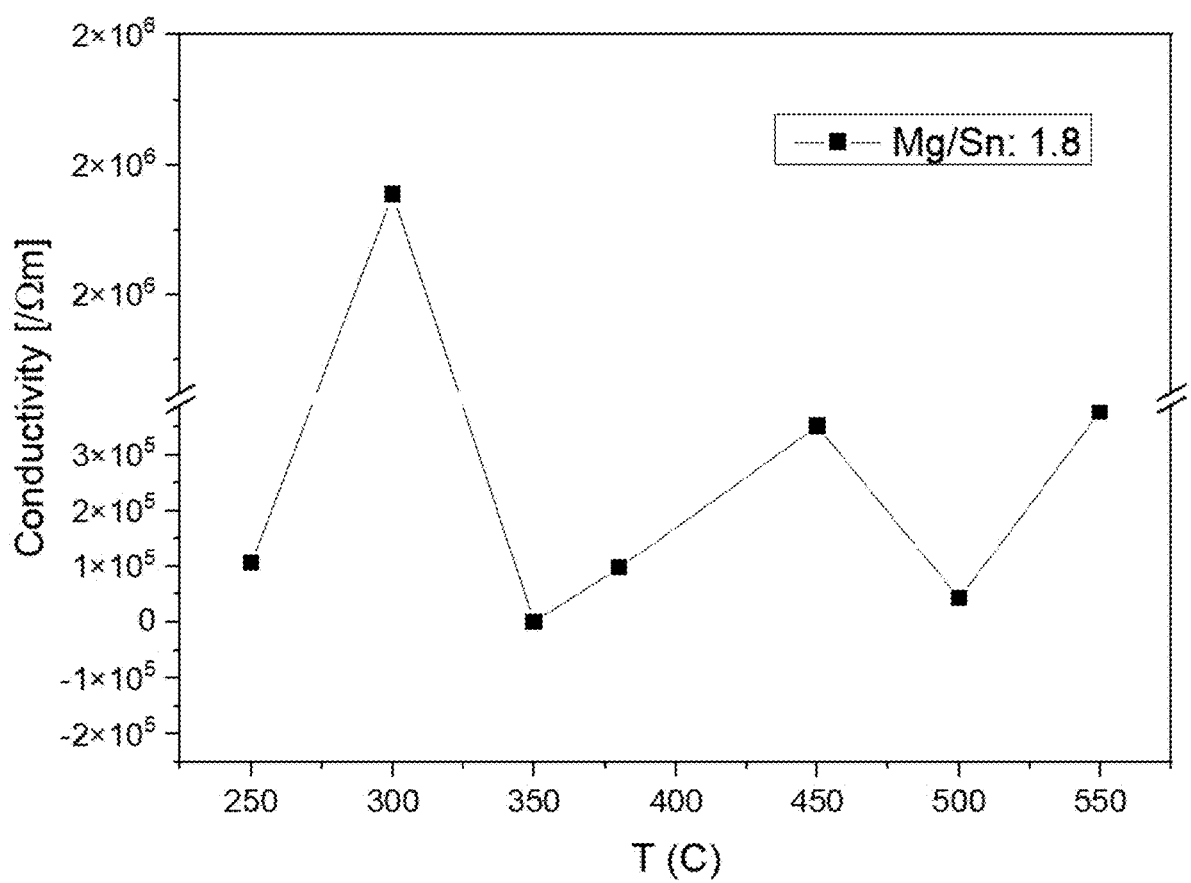
Figure 5E:
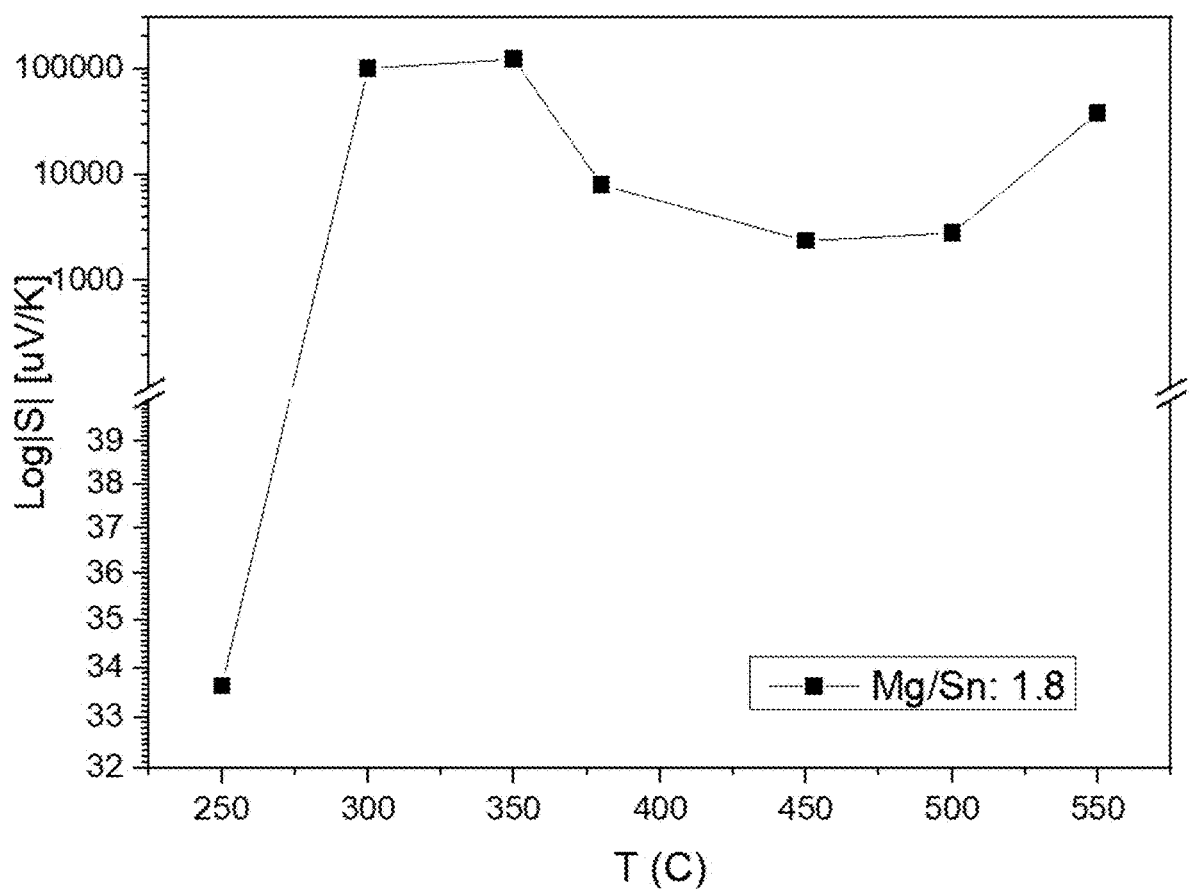
Figure 5F:
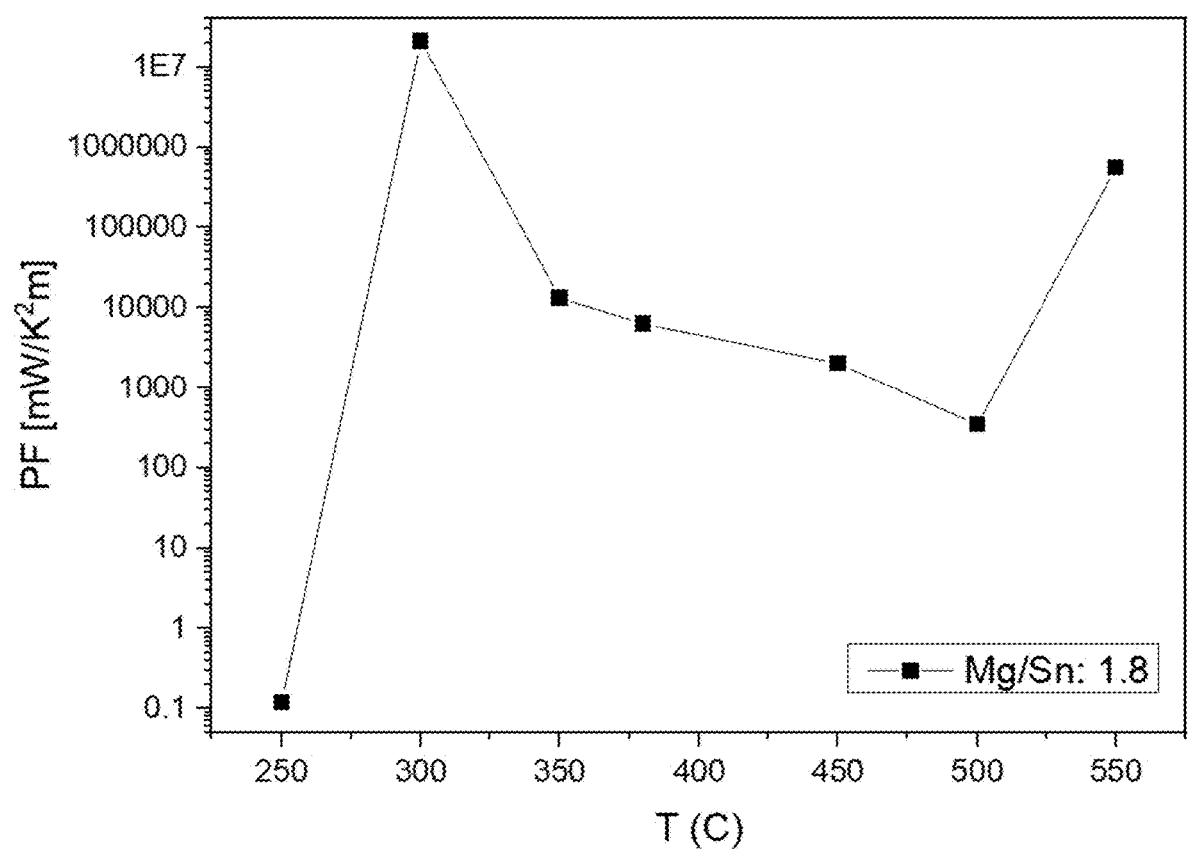

Resistivity and Seebeck coefficients of the Mg—Sn films were simultaneously measured as functions of temperature in the range of 30-400° C. for Example 1 and in the range of 250-550° C. for Example 2. FIGS. 4A-4C show plots of Seebeck coefficients in the deposited Mg—Sn films of Example 1 against temperatures. A positive sign for all films indicates p-type semiconductor behavior. With reference to FIG. 4 FIGS. 4A-4C, the samples with Mg/Sn ratios of 2.5, 2.1 and 1.9 yielded high power factors of 1.6, 1.4, and 1.2 $uWm^{-1}K^{-2}$, respectively, but none of these samples had very high Seebeck coefficients (S) over the given temperature range. In this experimental example, it is shown that improvement of the linearity of the deposition rate leads to a great increase in power factor.

FIGS. 5A-5F show plots of Seebeck coefficients in the deposited Mg—Sn films of Example 2 against temperatures. The samples of Example 2 generally had much smaller Seebeck coefficients and power factors than those of Example 1, but the sample with a Mg/Sn ratio of 1.8 showed a very high Seebeck coefficient and power factor in the range of 300 to 500° C.

Figure 6A:
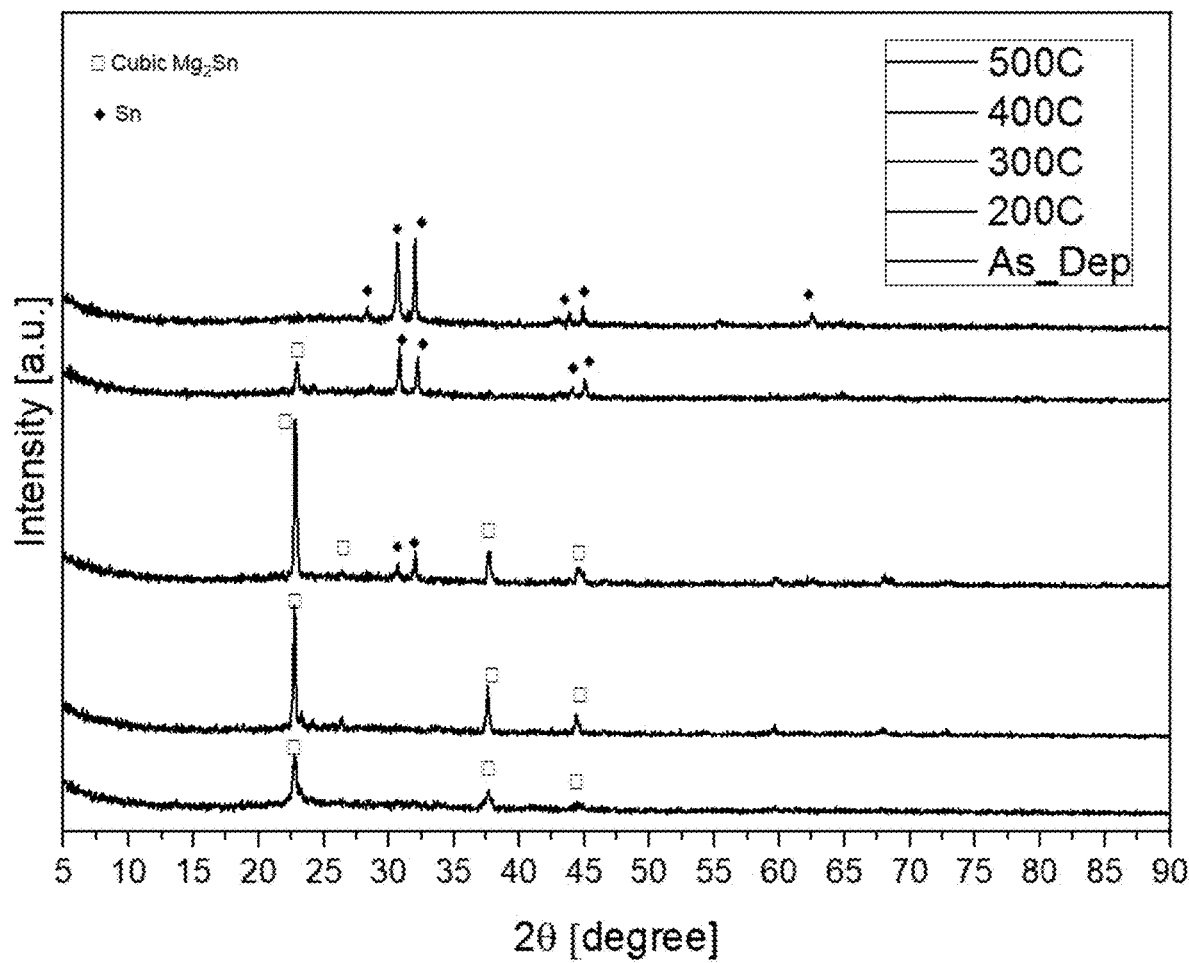
FIGS. 6a and 6b are XRD patterns of the Mg-rich and Mg-poor films annealed at 500° C. for 2 hours
Figure 6B:
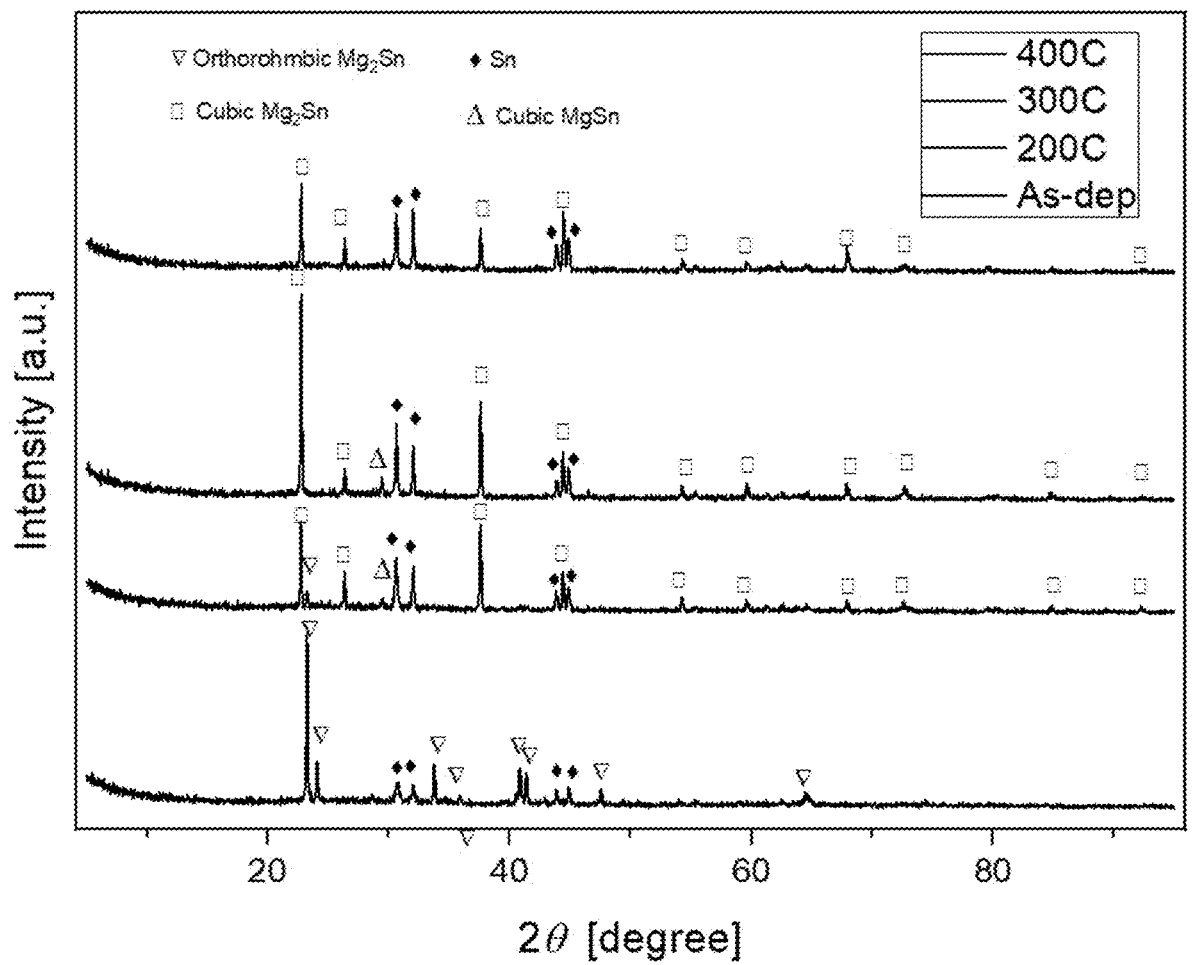

To understand this behavior, in-situ XRD and Hall effects were measured. To examine the thermal stability of different phases of the Mg—Sn films, Mg-rich cubic and Mg-poor orthorhombic films were prepared and subjected to different annealing temperatures and durations. FIGS. 6a and 6b are XRD patterns of the Mg-rich and Mg-poor films annealed at 500° C. for 2 hours. Up to 300° C., both of the samples remained stable and increased in the intensity of the main peak. This may be due to the reaction between unreacted Mg and Sn atoms during annealing. As the temperature further increased, the orthorhombic phase changed to the cubic phase while the peak intensity associated with the secondary Sn phase increased. On the other hand, the cubic Mg—Sn films decomposed completely into Mg and Sn at 500° C. The XRD patterns of the two phases of the Mg—Sn film indicate the de-alloying process at high temperatures.

Figure 6C:
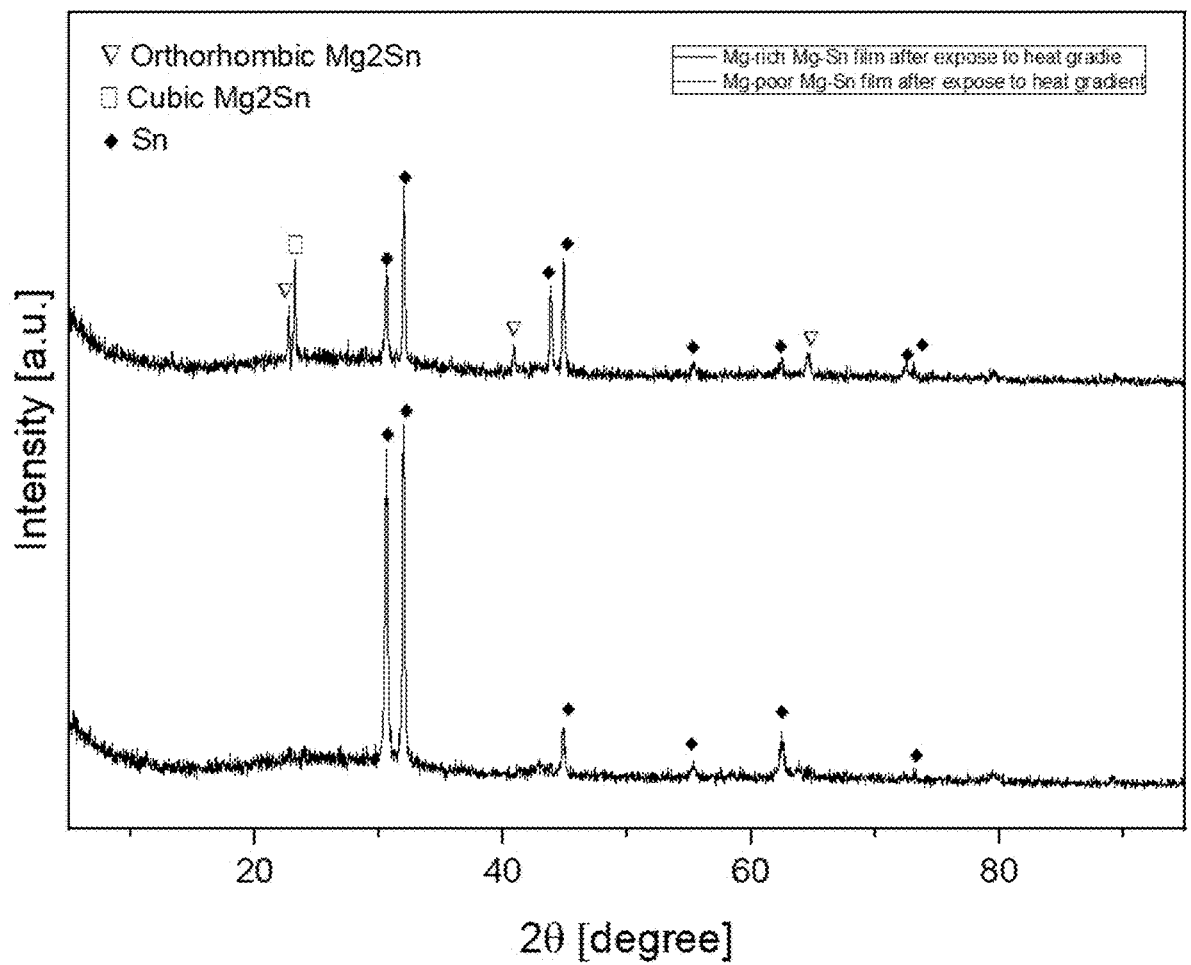
FIG. 6c shows XRD patterns of the Mg-rich and Mg-poor films after a Seebeck coefficient test at up to 500° C. for 12 hours.

FIG. 6c shows XRD patterns of the Mg-rich and Mg-poor films after a Seebeck coefficient test at up to 500° C. for 12 hours. From the XRD patterns presented in FIGS. 6a to 6c, it can be understood that the cubic Mg—Sn films have metallic properties composed of Sn and Mg metals at high temperatures, whereas the orthorhombic Mg—Sn films at temperatures above 300° C. consist of alloy MgSn phases, Sn phases, and Mg atoms.

Figure 7:
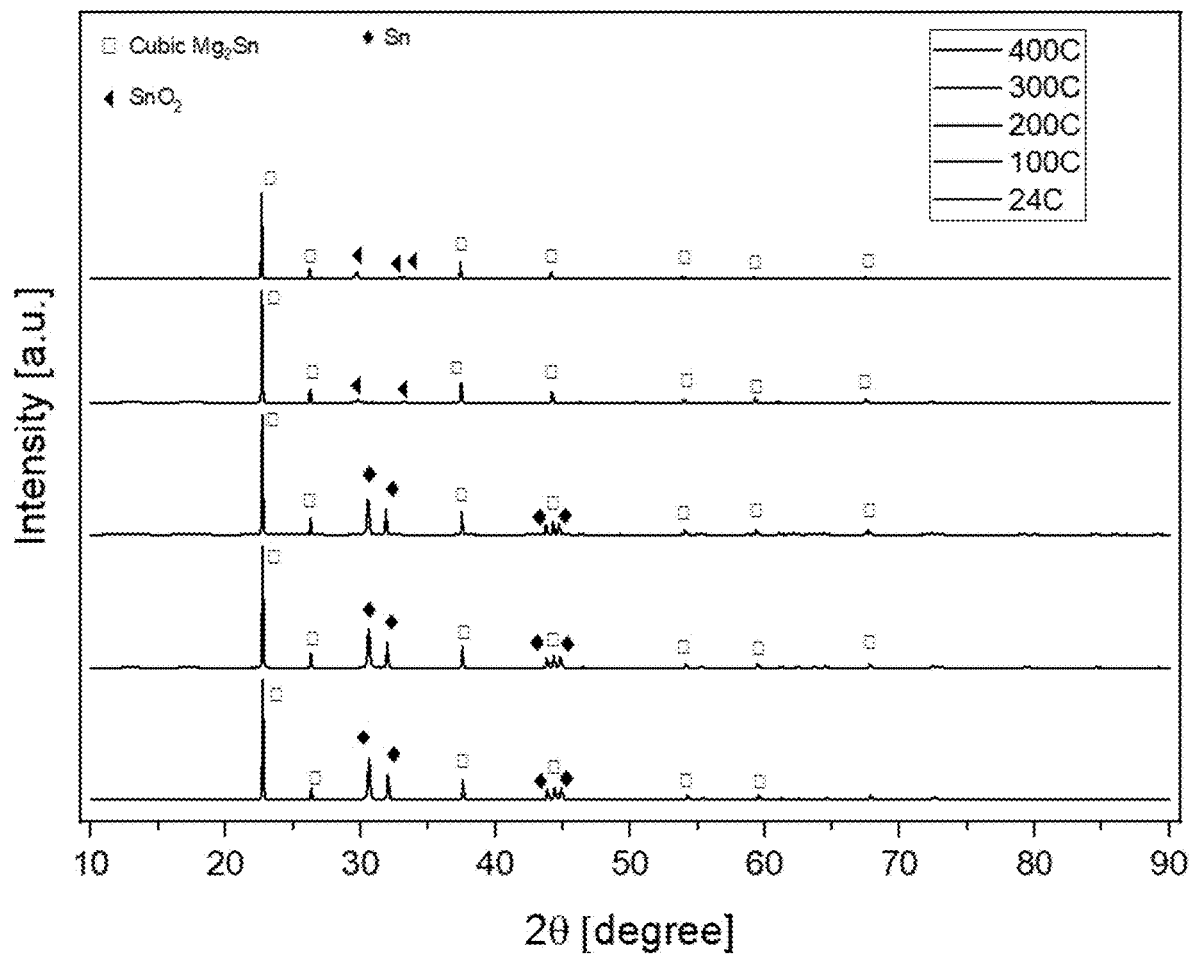
FIG. 7 shows in-situ XRD patterns of the Mg—Sn films in the temperature range of 30-400° C.

To study the de-alloying process in more detail, high-temperature X-ray diffraction (HT-XRD) was used to perform in-situ XRD measurements of samples exhibiting colossal values of the Seebeck coefficients in the temperature range of 300-500° C. Prior to in-situ XRD measurement, the samples were annealed at 300° C. for 2 hours. FIG. 7 shows in-situ XRD patterns of the Mg—Sn films in the temperature range of 30-400° C. While the $Mg_2Sn$ peak positions in this XRD patterns did not change, but were fixed at 2θ angles of 22.7°, 26.3°, 37.6° and 44.3°, these peaks slightly shifted to lower angles and slightly broadened with increasing temperature, suggesting distortion of the unit cell. As the peak width is mainly affected by the crystalline domain size, the broadened peaks and some defects at 300° C. were considered to prevent $Mg_2Sn$ from continuing to grow into larger particles. Dealloying appeared to occur preferentially at crystallographic defects, i.e., stacking faults, which provide a high density of vacancies and consequently facilitate the diffusion of alloying element atoms. The peaks at 2θ angles of 43.8, 44.9°, 30.6°, and 32.01°, associated with the secondary Sn phase, disappeared, and new peaks appeared at 2θ angles of 29.66°, 32.8°, and 33.2°, which are correlated with $SnO_2$ and Mg metal peaks. Meanwhile, these peaks may vary depending on the fabrication method. The disappearance of the Sn peak at 300° C. indicates that Sn melted at this temperature. As the temperature increased, Sn changed to SnO and finally to $SnO_2$.

Figure 8A:
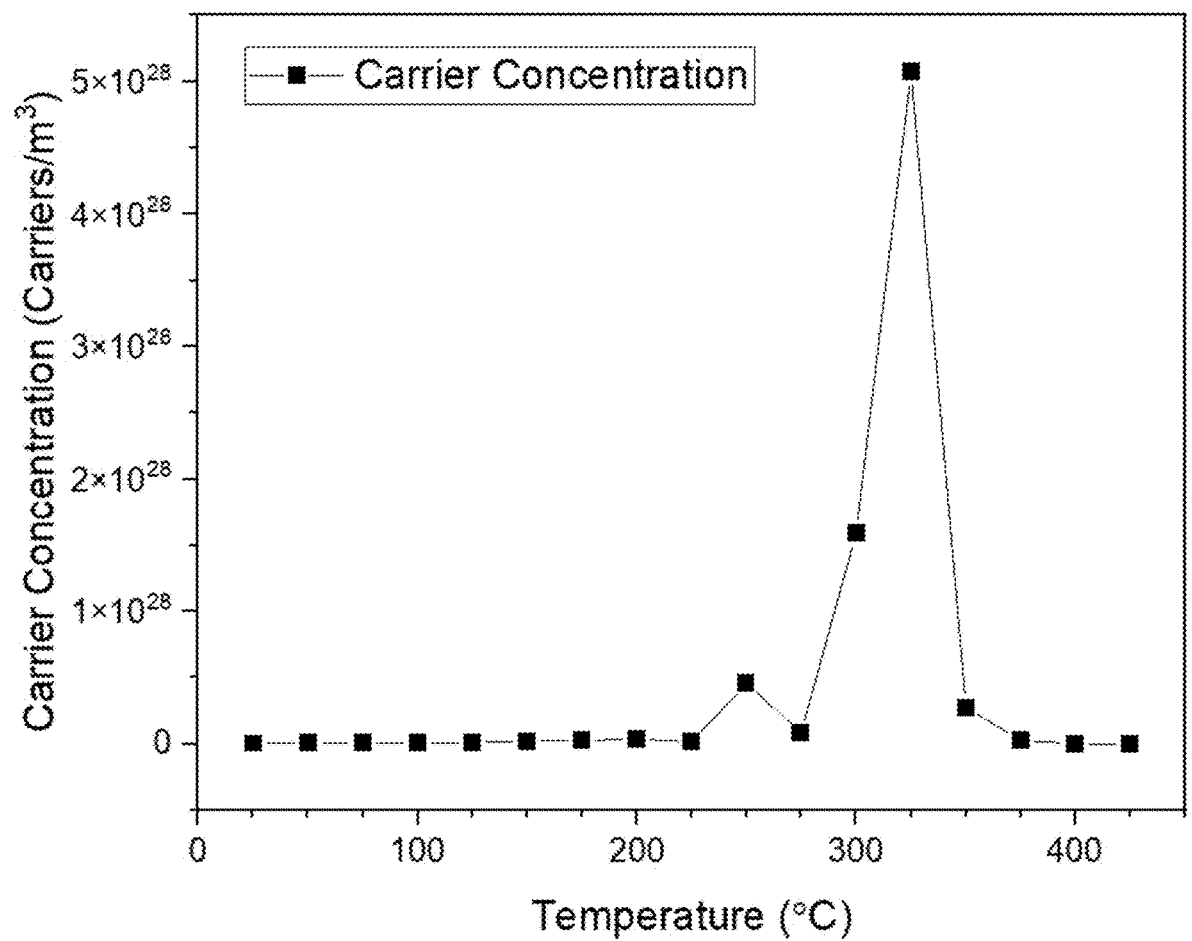
FIG. 8a shows carrier concentrations (carriers/$m^3$) of the annealed Mg—Sn films at 300° C. showing colossal Seebeck coefficient.
Figure 8B:
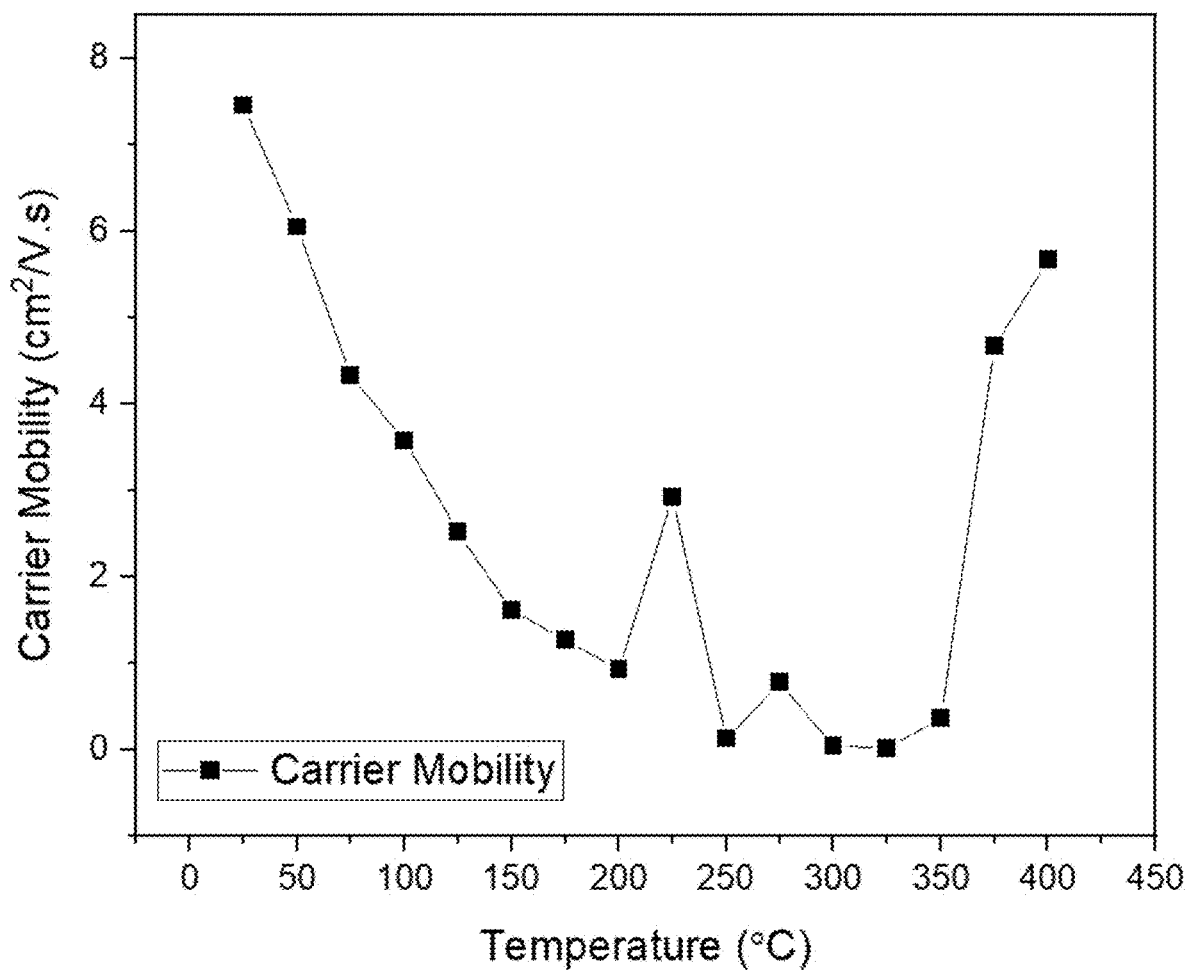
FIG. 8b shows carrier mobility ($cm^2/V·s$) of the annealed Mg—Sn films at 300° C. showing colossal Seebeck coefficient.

Mg—Sn films exhibiting colossal Seebeck coefficients were measured for an in-situ Hall effect and four-probe electric conductivity, using the van der Pauw technique so as to determine the concentration and mobility of charge carriers at high temperatures. FIG. 8 shows plots of carrier concentrations (carriers/$m^3$) against temperature (T) wherein T stands for ° C. FIG. 8a shows carrier concentrations (carriers/$m^3$) of the annealed Mg—Sn films at 300° C. showing colossal Seebeck coefficient, FIG. 8b shows carrier mobility ($cm^2$/V·s) of the annealed Mg—Sn films at 300° C. showing colossal Seebeck coefficient. The carrier concentration was measured to be $3\times10^{25}$ $m^{-3}$ at 200° C., rapidly increase at around 300° C., and decreased at higher than 400° C. The carrier concentration reached the maximum of $3\times10^{28}$ $cm^{-3}$ at about 300° C., which was almost 10 times as much as that at the normal temperature. The samples showed p-type conductivity at up to 250° C., and rapidly changed from p-type to n-type conductivity as the temperature increased, which was consistent with data from the Seebeck test. As shown in the previous results, the dealloying and/or demagnesiation of the Mg—Sn films seemed to start at temperatures above 300° C.

Figure 9:
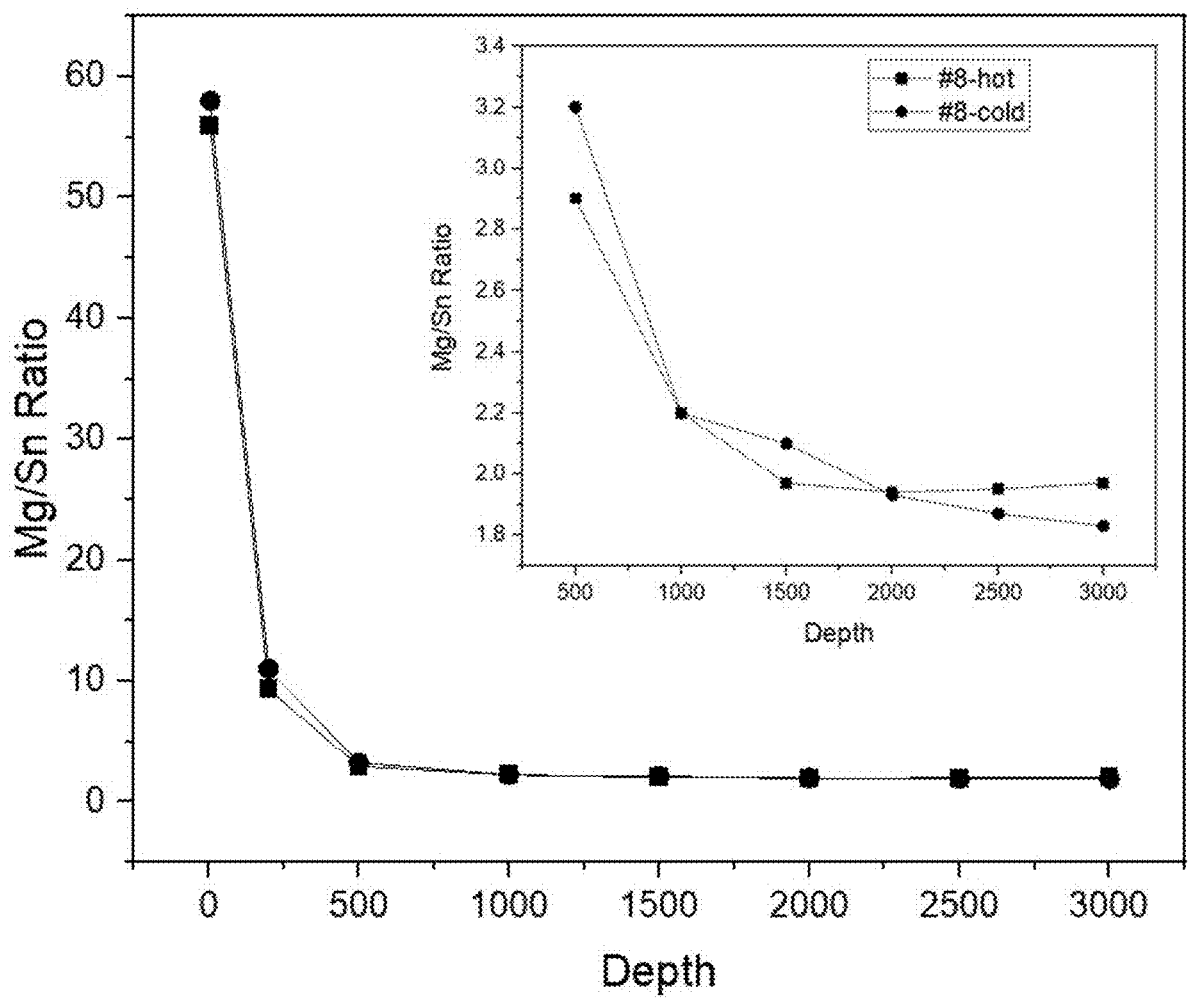
FIG. 9 shows compositional depth profiles of the cold and hot side of the sample showing colossal Seebeck coefficient.

After application of a thermal gradient thereto, the Mg—Sn films having colossal Seebeck coefficients were analyzed for Mg and Sn concentration distribution by XPS. The Mg—Sn films subjected to Seebeck coefficient measurements were taken out of the chamber immediately after the first appearance of a great Seebeck coefficient and then sliced into two parts representing the cold and hot sides of the sample. To apply a thermal gradient to the Mg—Sn film, the sample was mounted between two ceramic heaters operated by a proportional-integral-differential (PID) controller. While the bottom surface of the heater was completely attached to the substrate, the top part of the heater was slightly spaced from the surface of the Mg—Sn film. FIG. 9 shows depth profiles obtained by XPS together with $Ar^+$ ion etching. As can be seen, a Mg-rich Mg—Sn layer is disposed near the surfaces of both the cold and hot sides of the sample, a stoichiometric Mg—Sn layer in the center, and a Mg-poor Mg—Sn layer near the substrate. The cold side showed a much higher Mg concentration at the film surface. That is, it could be seen that the de-alloyed Mg atoms were much more diffused and concentrated/deposited on the surface and cold side.

As demagnesiation proceeds in a compound composed of molten Sn metal and alloy $Mg_2Sn$, some of the Mg metal ionizes and starts to migrate under a thermal gradient. Considering all the experimental results above, the following conditions must be satisfied to obtain huge Seebeck coefficients and power factors in Mg—Sn films. First, the Mg—Sn film should contain enough molten Sn metal to promote the migration of other particles as a result of the thermal gradient. The Mg-doped Sn layer on the substrate seems to help the formation of nanoparticle Sn crystals in the film. In addition, the demagnesiation must proceed at a certain rate so that there are both defective $Mg_2Sn$ and elemental Mg in the mixture.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A thermoelectric material showing a Seebeck coefficient of more than $10\ mVK^{-1}$ at a temperature of 300 to 500° C., comprising an Mg-poor $Mg_2Sn$ crystal and Secondary Sn phase with a Mg/Sn atomic ratio of about 1.8, the Mg-poor $Mg_2Sn$ crystal having an X-ray diffraction (XRD) exhibiting a 2θ peak at 23.11.

2. The thermoelectric material of claim 1, wherein the thermoelectric material has a Mg concentration gradient formed by thermal diffusion therein.

3. The thermoelectric material of claim 1, wherein the thermoelectric material comprises a $Mg_2Sn$ alloy, a molten Sn metal, and a Mg element at a temperature of 300 to 500° C.

4. The thermoelectric material of claim 1, wherein the XRD exhibits a 2θ peak at 24.05.

5. The thermoelectric material of claim 1, wherein the XRD exhibits a 2θ peak at 33.55.

6. The thermoelectric material of claim 1, wherein the XRD exhibits a 2θ peak at 40.80.

7. The thermoelectric material of claim 1, wherein the XRD exhibits a 2θ peak at 41.35.

8. The thermoelectric material of claim 1, wherein the XRD exhibits 2θ peaks at 23.11, 24.05, 33.55, 40.80, and 41.35.

* * * * *